(12) United States Patent
Icel et al.

(10) Patent No.: US 7,986,008 B2
(45) Date of Patent: Jul. 26, 2011

(54) SOI SEMICONDUCTOR COMPONENTS AND METHODS FOR THEIR FABRICATION

(75) Inventors: Ali Icel, Cupertino, CA (US); Qiang Chen, Sunnyvale, CA (US); Mario M. Pelella, Mountain View, CA (US)

(73) Assignee: Advanced Micro Devices, Inc., Austin, TX (US)

( * ) Notice: Subject to any disclaimer, the term of this patent is extended or adjusted under 35 U.S.C. 154(b) by 133 days.

(21) Appl. No.: 12/413,185

(22) Filed: Mar. 27, 2009

(65) Prior Publication Data
US 2009/0184372 A1 Jul. 23, 2009

Related U.S. Application Data

(62) Division of application No. 11/538,001, filed on Oct. 2, 2006, now Pat. No. 7,531,403.

(51) Int. Cl.
*H01L 27/12* (2006.01)
(52) U.S. Cl. ........................... 257/351; 438/153
(58) Field of Classification Search .................. 257/351, 257/204, 274; 438/153, 188, 199, 967
See application file for complete search history.

(56) References Cited

U.S. PATENT DOCUMENTS 6,664,593 B2 * 12/2003 Peake ........................... 257/336
2008/0124884 A1 5/2008 Pelella et al.
* cited by examiner

*Primary Examiner* — Charles D Garber
*Assistant Examiner* — Reema Patel
(74) *Attorney, Agent, or Firm* — Ingrassia Fisher & Lorenz, P.C.

(57) ABSTRACT

SOI semiconductor components and methods for their fabrication are provided wherein the SOI semiconductor components include an MOS transistor in the supporting semiconductor substrate. In accordance with one embodiment the component comprises a semiconductor on insulator (SOI) substrate having a first semiconductor layer, a layer of insulator on the first semiconductor layer, and a second semiconductor layer overlying the layer of insulator. The component includes source and drain regions of a first conductivity type and first doping concentration in the first semiconductor layer. A channel region of a second conductivity type is defined between the source and drain regions. A gate insulator and gate electrode overlie the channel region. A drift region of the first conductivity type is located between the channel region and the drain region, the drift region having a second doping concentration less than the first doping concentration of the first conductivity determining dopant.

20 Claims, 12 Drawing Sheets

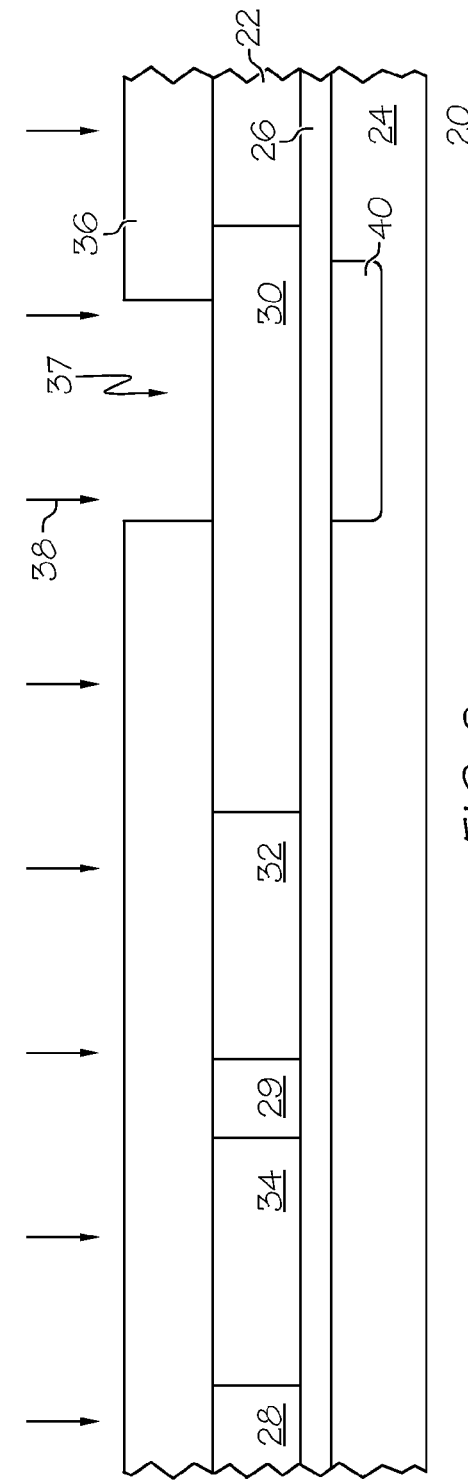

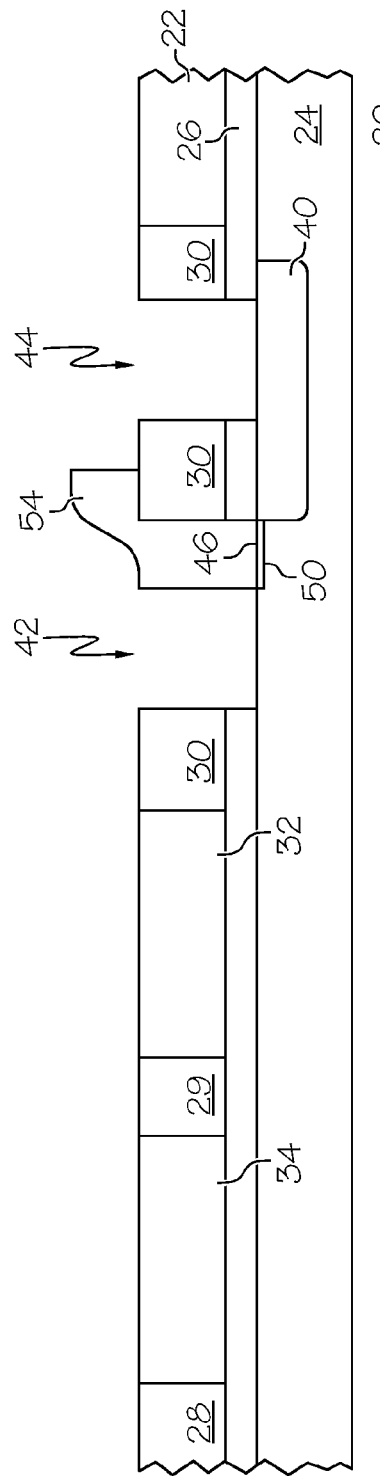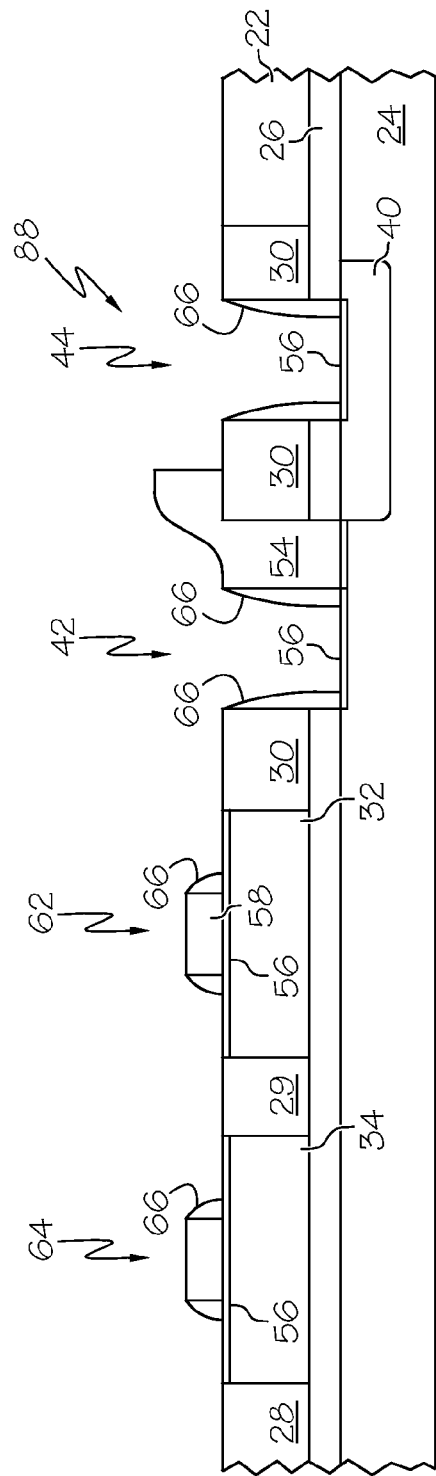

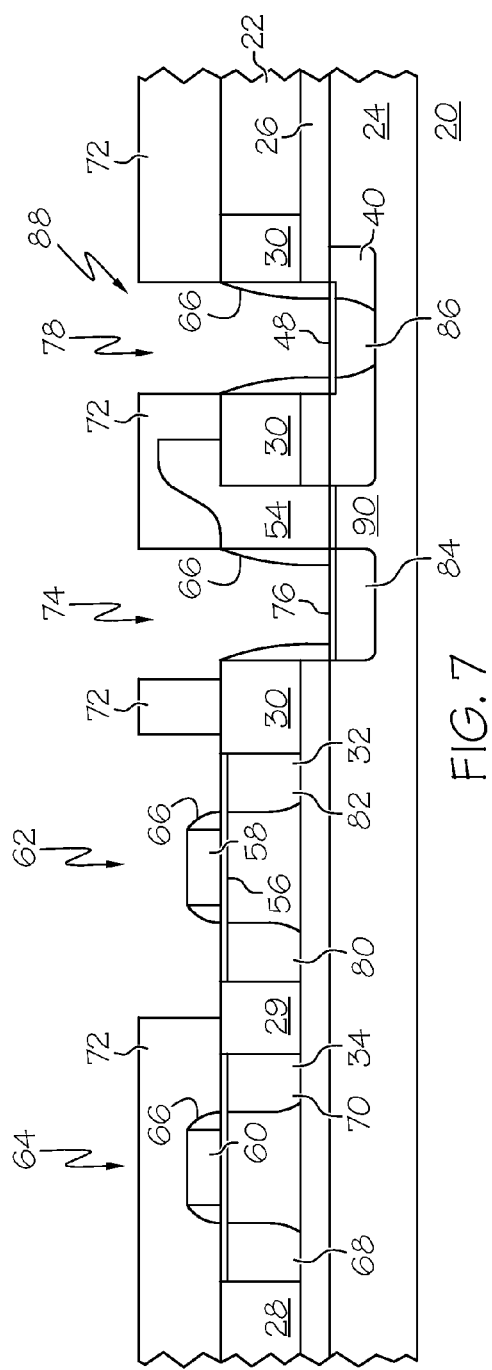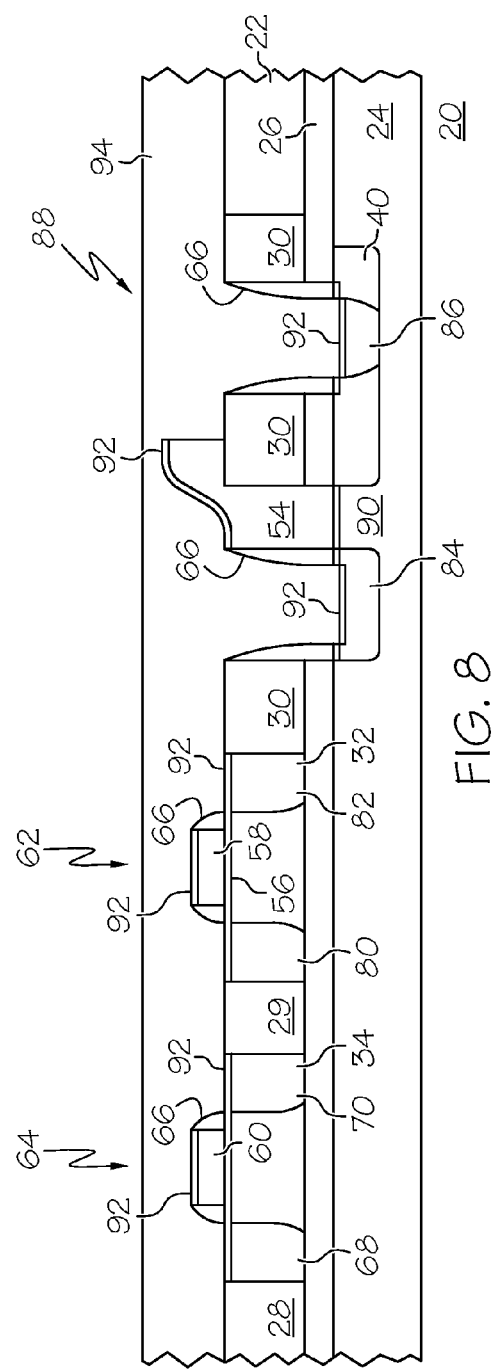

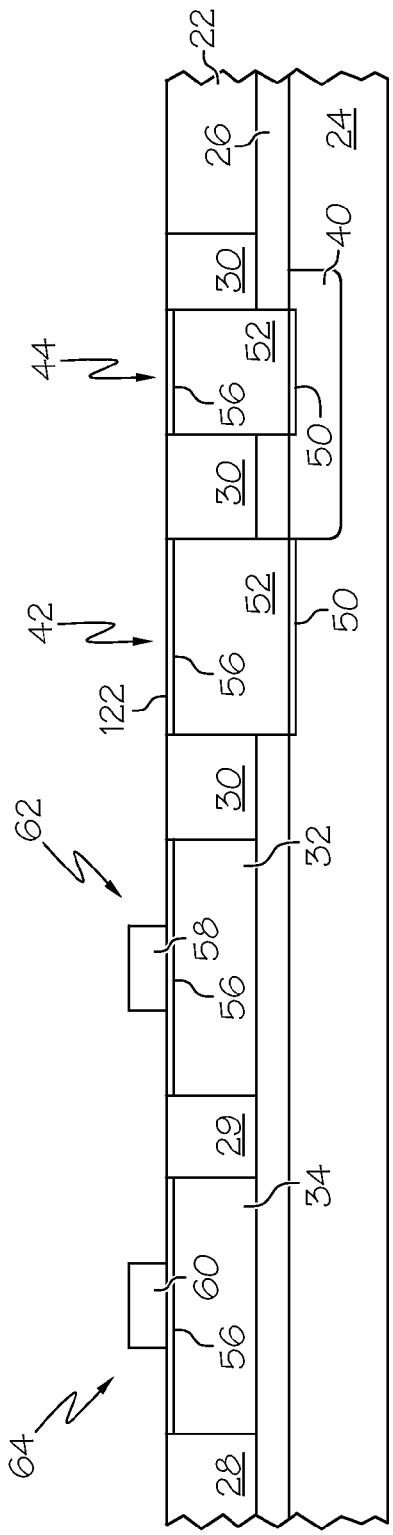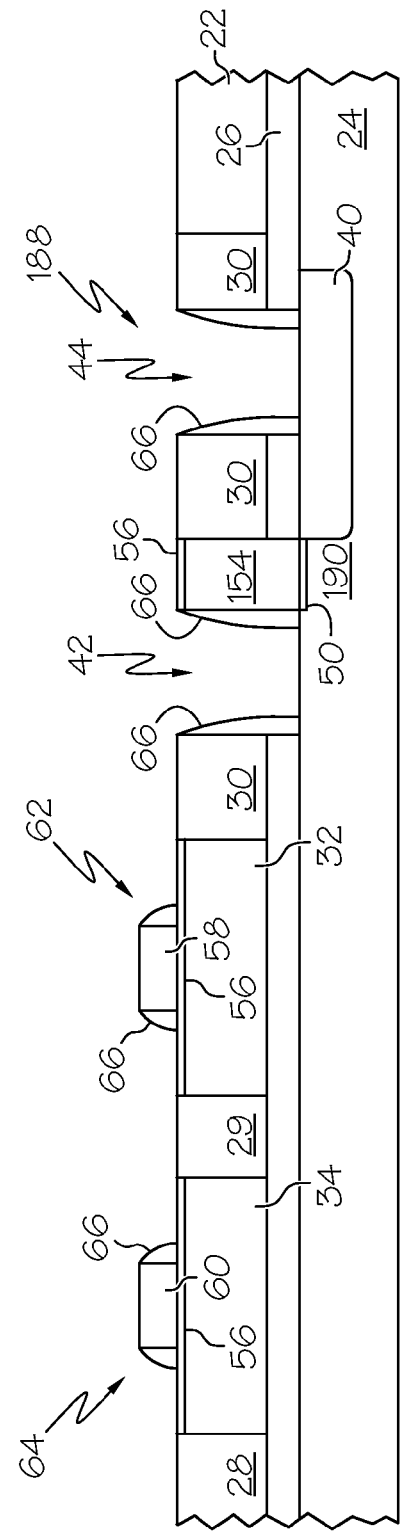

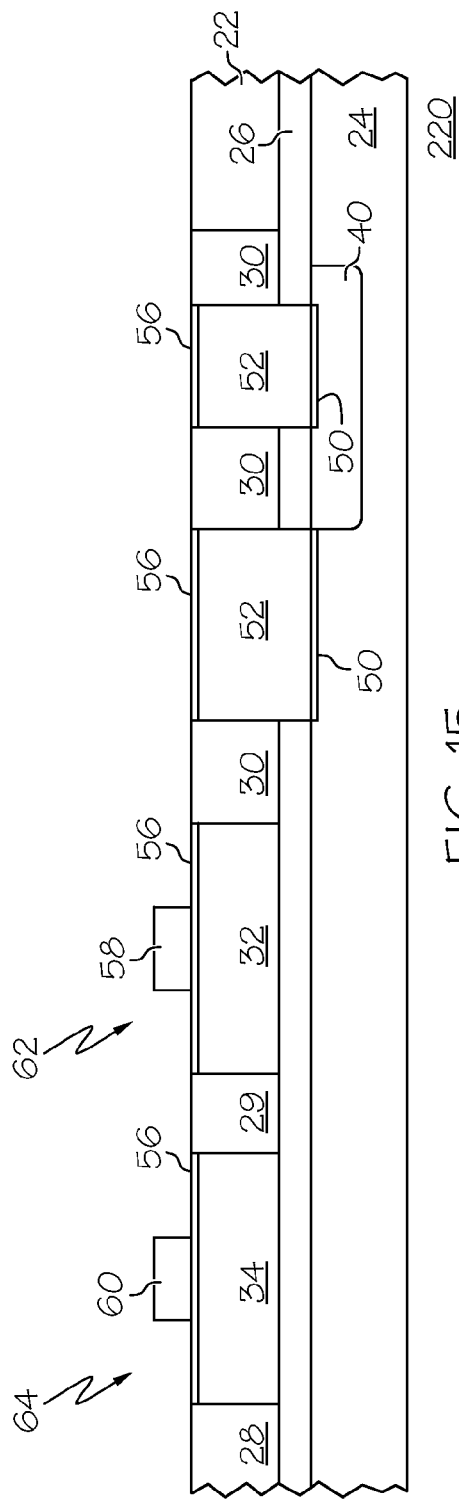
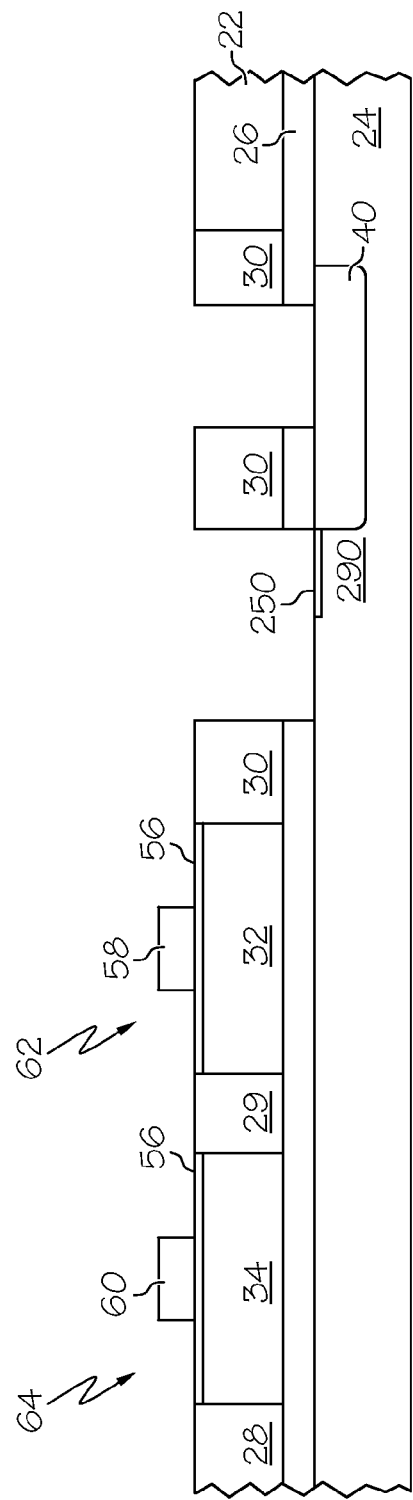

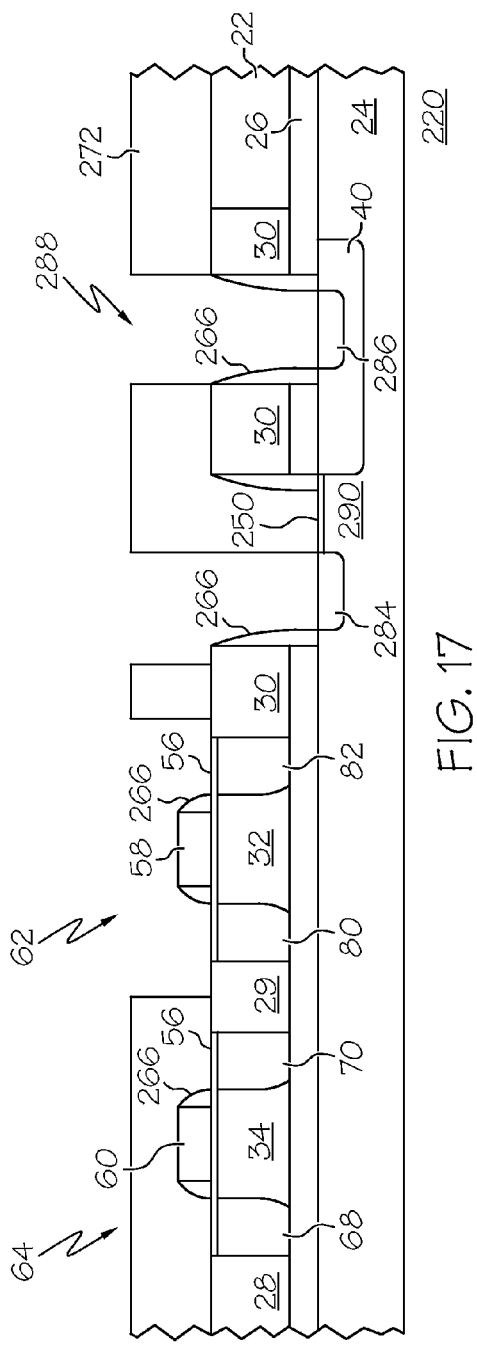
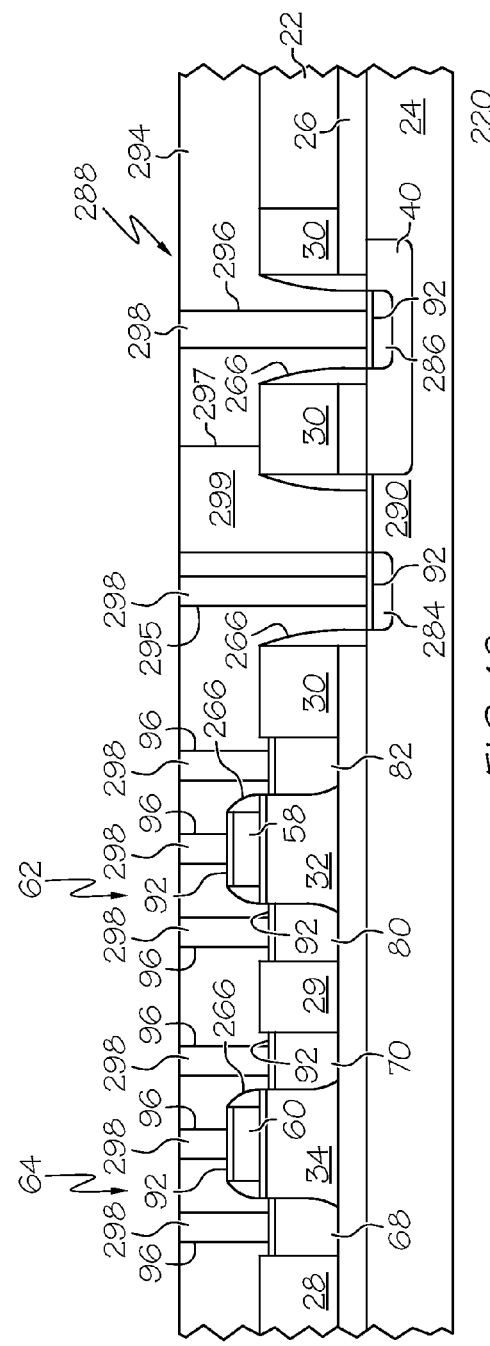
FIG. 17
FIG. 18

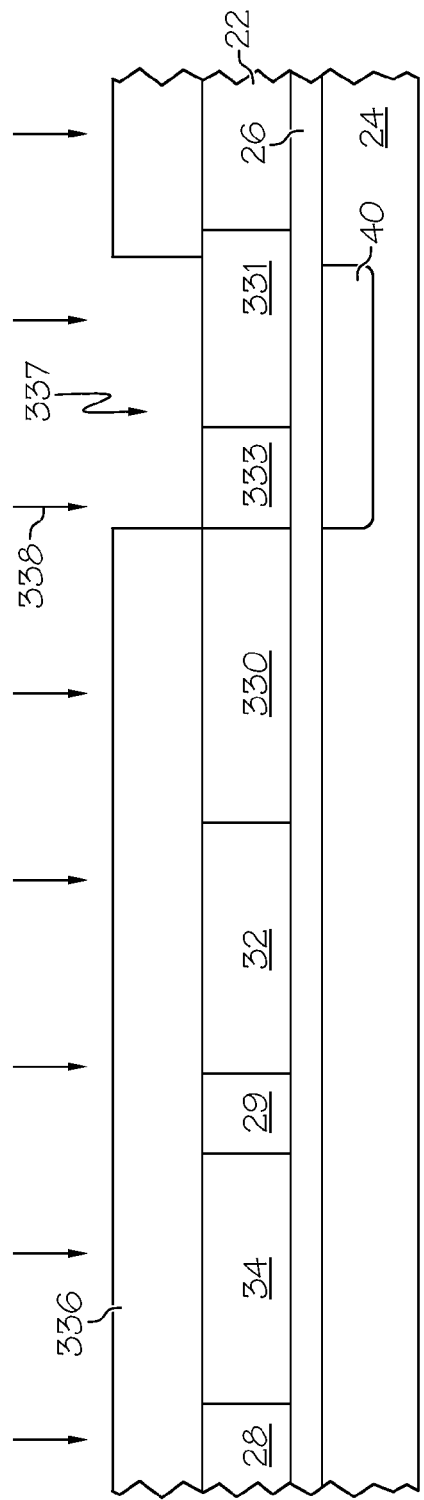
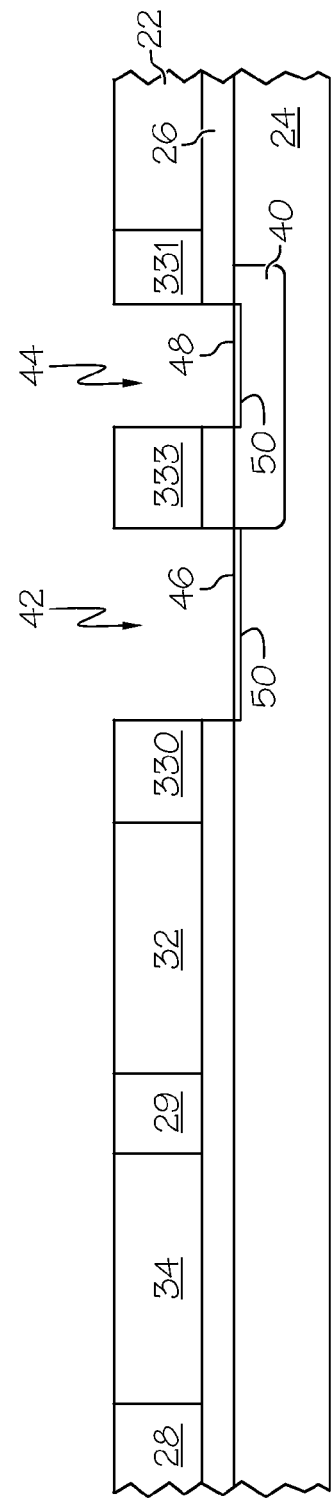

SOI SEMICONDUCTOR COMPONENTS AND METHODS FOR THEIR FABRICATION

CROSS-REFERENCES TO RELATED APPLICATIONS

This is a division of application Ser. No. 11/538,001, filed Oct. 2, 2006.

TECHNICAL FIELD

The present invention generally relates to semiconductor on insulator components and to methods for their fabrication, and more particularly relates to SOI semiconductor components having an MOS transistor, and preferably a high voltage MOS transistor, formed in the supporting substrate and to methods for their fabrication.

BACKGROUND

The majority of present day integrated circuits (ICs) are implemented by using a plurality of interconnected field effect transistors (FETs), also called metal oxide semiconductor field effect transistors (MOSFETs or MOS transistors). The ICs are usually formed using both P-channel (PMOS) and N-channel (NMOS) FETs and the IC is then referred to as a complementary MOS or CMOS circuit. Certain improvements in performance of MOS ICs can be realized by forming the MOS transistors in a thin layer of semiconductor material overlying an insulator layer. Such semiconductor on insulator (SOI) MOS transistors, for example, exhibit lower junction capacitance and hence can operate at higher speeds. It is advantageous in certain applications, however, to fabricate at least some devices in the semiconductor substrate that supports the insulator layer. The devices formed in the substrate, for example, may have better thermal properties and can support higher voltages than devices formed in the thin semiconductor layer. High voltage transistors generate self heating during operation, and it is difficult to dissipate the heat so generated if the transistors are fabricated in the thin layer of semiconductor material because of the low thermal conductivity of the insulator layer separating the thin layer from the supporting substrate. The heating can reduce the mobility of majority carriers in the channel and can compromise reliability of the IC. In contrast, heat generated in high voltage transistors, if the transistors are formed in the supporting substrate, would be able to dissipate because of the relatively high thermal conductivity of the supporting substrate.

Accordingly, it is desirable to provide an SOI MOS component having a substrate transistor integrated with MOS transistors formed in and on the thin semiconductor layer. In addition, it is desirable to provide methods for fabricating an MOS transistor in the supporting substrate of an SOI component and especially to provide methods for integrating methods for fabricating substrate MOS transistors with methods for fabricating complementary MOS transistors in the thin semiconductor layer. Furthermore, other desirable features and characteristics of the present invention will become apparent from the subsequent detailed description and the appended claims, taken in conjunction with the accompanying drawings and the foregoing technical field and background.

BRIEF SUMMARY

An SOI component is provided that includes an MOS transistor in the supporting semiconductor substrate. The component comprises a semiconductor on insulator (SOI) structure having a first semiconductor layer, a layer of insulator on the first semiconductor layer, and a second semiconductor layer overlying the layer of insulator. The component includes source and drain regions of first conductivity type and first doping concentration formed in the first semiconductor layer. A channel region of second conductivity type is defined between the source and drain regions. A gate insulator and gate electrode overlie the channel region. A drift region of first conductivity type is located between the channel region and the drain region, the drift region having a second doping concentration less than the first doping concentration of first conductivity determining dopant.

A method is provided for fabricating a semiconductor component including a semiconductor on insulator (SOI) substrate having a first semiconductor layer of first conductivity type, a layer of insulator on the first semiconductor layer, and a second semiconductor layer overlying the layer of insulator. The method comprising the steps of impurity doping a first portion of the first semiconductor layer to form a drift region of second conductivity type and forming a gate insulating layer overlying a second portion of the first semiconductor layer. A gate electrode material is deposited overlying the gate insulating layer. A portion of the drift region is impurity doped to form a drain region of second conductivity type and a third portion of the first semiconductor layer is impurity doped to form a source region of second conductivity type. A P-channel MOS transistor and an N-channel MOS transistor are formed in and on the second semiconductor layer.

BRIEF DESCRIPTION OF THE DRAWINGS

The present invention will hereinafter be described in conjunction with the following drawing figures, wherein like numerals denote like elements, and wherein FIGS. 1-9 schematically illustrate, in cross section, method steps for the manufacture of a CMOS integrated circuit component in accordance with various embodiments of the invention;

FIGS. 10-14, taken together with FIGS. 1-4, 7, and 8, illustrate, in cross section, method steps for the manufacture of a CMOS integrated circuit component in accordance with a further embodiment of the invention;

FIGS. 15-18, taken together with FIGS. 1-4 and 10, illustrate, in cross section, method steps for the manufacture of a CMOS integrated circuit component in accordance with another embodiment of the invention; and FIGS. 19-24, taken together with FIG. 1, illustrate, in cross section, method steps for the manufacture of a CMOS integrated circuit component in accordance with yet another embodiment of the invention.

DETAILED DESCRIPTION

Figure 3:
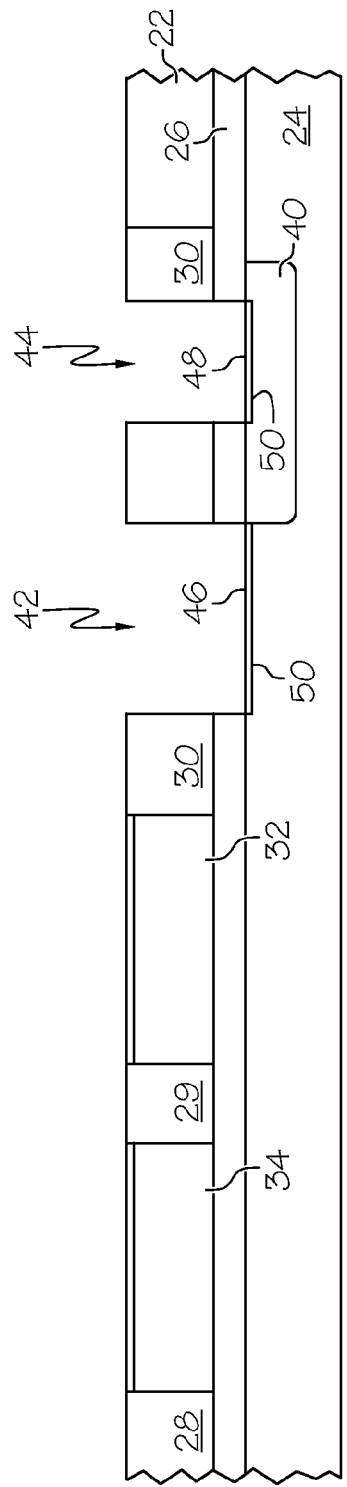

The following detailed description is merely exemplary in nature and is not intended to limit the invention or the application and uses of the invention. Furthermore, there is no intention to be bound by any expressed or implied theory presented in the preceding technical field, background, brief summary or the following detailed description.

FIGS. 1-24 schematically illustrate method steps for the manufacture of a CMOS integrated circuit component in accordance with various embodiments of the invention. Although the term "MOS device" properly refers to a device having a metal gate electrode and an oxide gate insulator, that term will be used throughout to refer to any semiconductor device that includes a conductive gate electrode (whether metal or other conductive material) that is positioned over a gate insulator (whether oxide or other insulator) which, in turn, is positioned over a semiconductor substrate. In these illustrative embodiments only a small portion of the CMOS integrated circuit component is illustrated. Various steps in the manufacture of CMOS devices are well known and so, in the interest of brevity, many conventional steps will only be mentioned briefly herein or will be omitted entirely without providing the well known process details. Although in this illustrative embodiment the integrated circuit component is a CMOS circuit, the invention is also applicable to the fabrication of a single channel type MOS circuit component.

FIGS. 1-9 illustrate a first embodiment of the invention for the fabrication of a CMOS integrated circuit component 20. As illustrated in FIG. 1, the method in accordance with this embodiment of the invention begins with providing a semiconductor on insulator (SOI) substrate 21. The SOI substrate is preferably a silicon substrate with a monocrystalline silicon layer 22 formed overlying a monocrystalline silicon carrier substrate 24. For convenience of description, but without limitation, the semiconductor material will hereinafter be referred to as silicon, but those of skill in the art will understand that other semiconductor materials such as germanium, gallium arsenide, and the like can also be used. As used herein, the terms "silicon layer" and "silicon substrate" will be used to encompass the relatively pure monocrystalline silicon materials typically used in the semiconductor industry as well as silicon admixed with other elements such as germanium, carbon, and the like to form substantially monocrystalline semiconductor material. Monocrystalline silicon layer 22 will be used in the formation of N-channel and P-channel MOS transistors. Monocrystalline silicon substrate 24 will be used for the formation of a substrate transistor, and specifically a transistor capable of high voltage operation. By "high voltage" is meant, in this context, a voltage of greater than about 25 volts. Monocrystalline silicon layer 22 can be formed, for example, by the well known layer transfer technique. In that technique hydrogen is implanted into a subsurface region of an oxidized monocrystalline silicon wafer and the implanted wafer is flip bonded to monocrystalline silicon substrate 24. A two phase heat treatment is carried out to split the hydrogen implanted wafer along the implanted region and to strengthen the bonding, leaving a thin monocrystalline silicon layer 22 bonded to the monocrystalline silicon substrate and separated from the substrate by a dielectric insulating layer 26. The monocrystalline silicon layer is thinned and polished, for example by chemical mechanical planarization (CMP) techniques, to a thickness of about 50-300 nanometers (nm) and preferably to a thickness of about 50-100 nm depending on the circuit function being implemented. Both the monocrystalline silicon layer and the monocrystalline silicon carrier substrate preferably have a resistivity of at least about 1-35 Ohms per square. The silicon can be impurity doped either N-type or P-type, but is preferably doped P-type. Dielectric insulating layer 26, typically silicon dioxide, preferably has a thickness of about 50-200 nm and most preferably a thickness of about 150-200 nm. Dielectric layer 26 is commonly referred to as a buried oxide or "BOX" and may be so referred to herein.

Having provided an SOI substrate 21, the method in accordance with one embodiment of the invention continues as illustrated in FIG. 2 by the formation of dielectric isolation regions 28, 29, and 30 extending through monocrystalline silicon layer 22 to dielectric layer or BOX 26. The dielectric isolation regions are preferably formed by the well known shallow trench isolation (STI) technique in which trenches are etched into monocrystalline silicon layer 22, the trenches are filled with a dielectric material such as deposited silicon dioxide, and the excess silicon dioxide is removed by CMP. STI regions 28 and 29 provide electrical isolation, as needed, between various devices of the CMOS circuit that are to be formed in monocrystalline silicon layer 22. In accordance with an embodiment of the invention, STI region 30 aids in electrically isolating a device to be formed in carrier substrate 24 from devices to be formed in monocrystalline silicon layer 22. Either before or after the formation of dielectric isolation regions 28, 29, and 30, portions of monocrystalline silicon layer 22 can be doped, for example by ion implantation, to form P-type well regions 32 and N-type well regions 34.

As also illustrated in FIG. 2, a layer of masking material 36 such as a layer of photoresist is applied overlying the surface of silicon layer 22 and is patterned to form a mask opening 37 overlying STI region 30. N-type conductivity determining ions are implanted, as indicated by arrows 38, through the mask opening, STI region 30, and BOX layer 26 and into supporting substrate 24 to form an N-type drift region 40. The implanted ions can be, for example, phosphorous ions implanted at an energy of about 200-250 KeV and a dose of about $2\times10^{13}$ cm$^{-2}$. The ion implantation and subsequent thermal cycling to which the implanted ions are subjected forms a drift region having a junction depth of about 0.5 microns (μ).

Masking material 36 is removed and another masking layer (not illustrated) is applied and patterned. The patterned masking layer is used as an etch mask and openings 42 and 44 are etched through STI region 30 and underlying dielectric layer 26 to expose portion 46 of the surface of supporting semiconductor substrate 24 and portion 48 of the surface of drift region 40 as illustrated in FIG. 3. A gate insulator 50 is formed on exposed portion 46 and exposed portion 48. Preferably the gate insulator is thermally grown silicon dioxide having a thickness of about 5-10 nm formed in conventional manner by subjecting the exposed surfaces to an oxidizing ambient at an elevated temperature.

Figure 4:
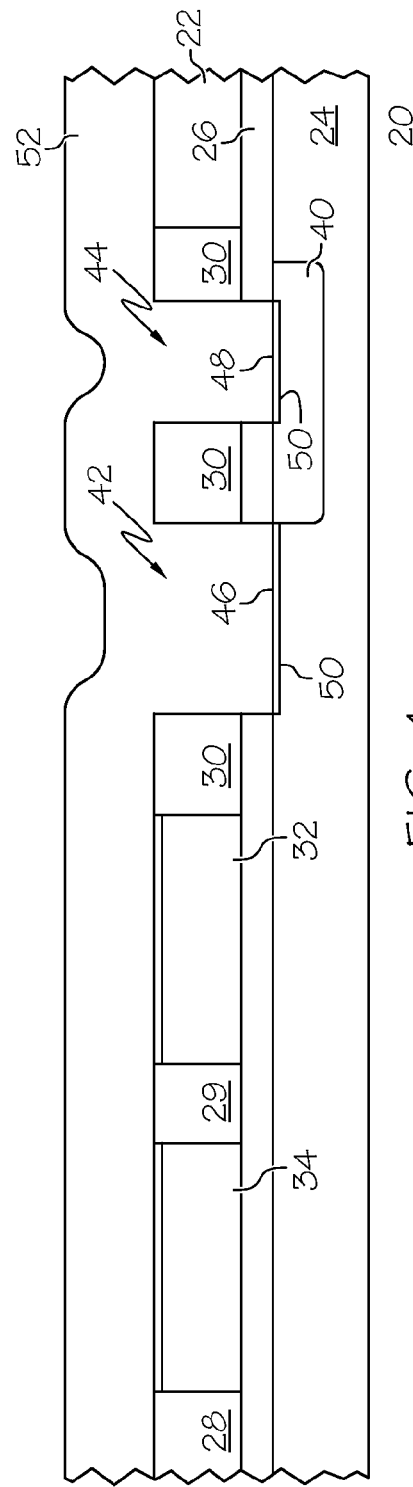

The method in accordance with an embodiment of the invention continues as illustrated in FIG. 4 by the deposition of a layer 52 of polycrystalline silicon or other gate electrode forming material. The gate electrode forming material will hereinafter be referred to for convenience, but without limitation, as polycrystalline silicon. The polycrystalline silicon can be deposited to a thickness of about 150-250 nm by chemical vapor deposition (CVD), low pressure chemical vapor deposition (LPCVD), or plasma enhanced chemical vapor deposition (PECVD) by the reduction of silane (SiH$_4$) or other silicon bearing reactant. Preferably the polycrystalline silicon is in situ doped by including impurity dopant impurities such as arsenic or phosphorous in the reactant gases.

Layer 52 of polycrystalline silicon is patterned and etched using conventional photolithography and etch methods to form a gate electrode 54 as illustrated in FIG. 5. Gate electrode 54 overlies a portion of gate insulator layer 50 which, in turn, overlies a portion of surface 46 of semiconductor support substrate 24. In accordance with an embodiment of the invention gate electrode 54 also overlies a portion of STI region 30 and BOX layer 26 that, in turn, overlie a portion of but not the entirety of drift region 40. Gate electrode 54 can be used as an etch mask to etch and remove gate insulator 50 that is not covered by the gate electrode.

As illustrated in FIG. 6, a gate insulator layer 56 is formed at the surface of P-type regions 32 and N-type regions 34. The gate insulator may be thermally grown silicon dioxide formed by heating the silicon substrate in an oxidizing ambient, or may be a deposited insulator such as a silicon oxide, silicon nitride, a high dielectric constant insulator such as HfSiO, or the like. Deposited insulators can be deposited in known manner, for example, by CVD, LPCVD, or PECVD. Gate insulator 56 is here illustrated as a thermally grown silicon dioxide layer that grows only on the exposed silicon surfaces. The gate insulator material is typically 1-10 nm in thickness. In accordance with one embodiment of the invention a layer of gate electrode forming material (not illustrated), preferably polycrystalline silicon, is deposited onto the layer of gate insulator. The gate electrode forming material will hereinafter be referred to for convenience but without limitation as polycrystalline silicon although those of skill in the art will recognize that other materials such as metals and metal silicides can also be employed. If the gate electrode material is polycrystalline silicon, that material is typically deposited to a thickness of about 50-200 nm and preferably to a thickness of about 100 nm by LPCVD by the hydrogen reduction of silane. The layer of polycrystalline silicon is preferably deposited as undoped polycrystalline silicon and is subsequently impurity doped by ion implantation. The polycrystalline silicon is patterned and etched using conventional processing to form gate electrodes 58 and 60. Gate electrode 58 will be the gate electrode of an NMOS transistor 62 and gate electrode 60 will be the gate of a PMOS transistor 64. Side wall spacers 66 are formed on the side walls of gate electrodes 58 and 60 as well as on the side walls of gate electrode 54 and the side walls of openings 42 and 44 through STI 30 and insulating layer 26. The side wall spacers can be formed in conventional manner by depositing a layer of sidewall spacer material such as silicon nitride, silicon oxide, silicon oxynitride, or other insulating material and preferably a layer of silicon dioxide overlaid by a layer of silicon nitride. The side wall spacer material is anisotropically etched, for example by reactive ion etching (RIE), to remove the spacer material from generally horizontal surfaces while leaving the material on generally vertical surfaces.

A layer of masking material (not illustrated) such as a layer of photoresist is applied and is patterned to provide an ion implantation mask exposing the area of N-type well regions 34 and masking the remainder of the IC. The patterned masking material is used, together with gate electrode 60 and the side wall spacers on the edges of gate electrode 60, as an ion implantation mask and P-type conductivity determining ions such as boron ions are implanted into N-type well regions 34 to form source 68 and drain 70 regions of PMOS transistor 64 as illustrated in FIG. 7. The patterned layer of masking material is removed and a further layer of masking material 72, such as a layer of photoresist, is applied and patterned to form an opening 74 exposing a portion 76 of silicon supporting substrate 24 adjacent gate electrode 54 and an opening 78 exposing portion 48 of the surface of drift region 40 formerly exposed through opening 44 as well as exposing the area of P-type well regions 32. The patterned masking material is used, together with gate electrode 58 and the side wall spacers on the edges of gate electrode 58, as an ion implantation mask and N-type conductivity determining ions such as arsenic ions are implanted into the P-type well regions to form source 80 and drain 82 regions of NMOS transistor 62 and source 84 and drain 86 regions of a high voltage substrate transistor 88. Drain region 86 is formed within N-type drift region 40 and is spaced apart from a channel region 90 defined at the surface of silicon carrier substrate 24 between drift region 40 and source region 84 formed in the silicon carrier substrate. Gate electrode 54 overlies the channel region. Although the formation of only one set of spacers and the implantation of only one dopant impurity has been illustrated for each of the transistors, those of skill in the art will understand that additional spacers may be formed in similar manner and additional implantations may be performed to form source/drain extensions, halo implants, and to alter the threshold voltage and punch through voltage of the MOS transistors.

Side wall spacers 66 are also used as a mask for the self aligned formation of metal silicide contacts to the ion implanted regions. Masking layer 72 is removed and the side wall spacers are used as an etch mask to remove any exposed oxide or other material. A layer of silicide forming metal (not illustrated) is deposited. The layer of silicide forming metal can be, for example, a layer of nickel, cobalt, titanium, or the like. The layer of silicide forming metal is heated, for example by rapid thermal annealing (RTA) to cause the metal to react with silicon with which the metal is in contact to form metal silicide contacts 92 as illustrated in FIG. 8. The metal silicide contacts are formed on the source and drain regions and on the tops of the gate electrodes. The silicide on the source and drain regions is spaced apart from the corresponding gate electrodes by the side wall spacers. Any of the silicide forming metal that is not in contact with silicon, for example the metal that overlies the side wall spacer or the dielectric isolation regions, does not react during the thermal annealing and can be removed by wet etching in a in a $H_2O_2/H_2SO_4$ or $HNO_3/HCl$ solution. A layer 94 of dielectric material (an interlayer dielectric or ILD) is deposited and planarized by CMP. Layer 94 can be, for example, a silicon oxide layer deposited by CVD, LPCVD, or PECVD using a tetraethylorthosilcate (TEOS) or other silicon source material.

Figure 9:
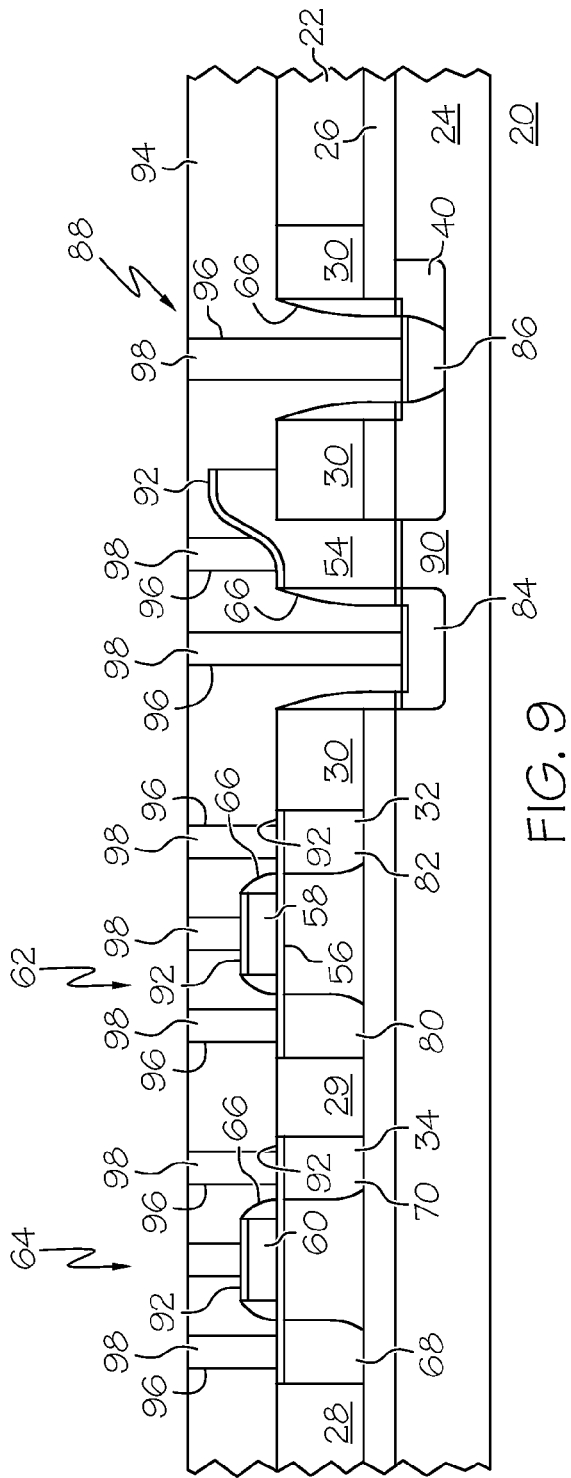

CMOS IC component structure 20 can be completed, in accordance with an embodiment of the invention by etching contact vias 96 through ILD layer 94 and filling the contact vias with conductive plugs 98 as illustrated in FIG. 9. The contact plugs make electrical contact to the silicided source and drain regions and to at least some of the gate electrodes. Those of skill in the art of semiconductor device manufacture will appreciate that other processing steps (not illustrated) may be practiced such as forming patterned interconnect metal lines, depositing and patterning additional ILD layers and additional metal interconnects.

Figure 10:
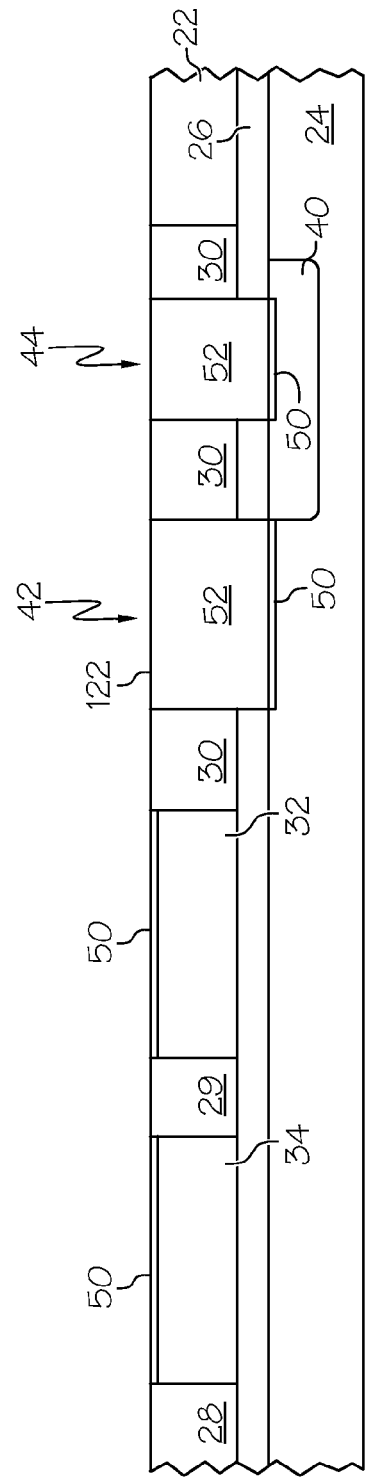

A further embodiment of the invention for the fabrication of a CMOS IC component 120 is illustrated in FIGS. 10-14 taken together with FIGS. 1-4, 7, and 8. The method in accordance with this embodiment of the invention begins in the same manner as described and illustrated above in FIGS. 1-4. As illustrated in FIG. 10, polycrystalline silicon layer 52 is planarized, for example by CMP, so as to form a planar upper surface 122. The STI dielectric isolation regions can be used as a polish stop during the CMP operation. Planarizing polycrystalline silicon layer 52 removes the polycrystalline silicon from the surface of the STI and from monocrystalline silicon layer 22 and the planarized surface makes subsequent photolithography steps easier than would be the case with a non-planarized surface.

As illustrated in FIG. 11, previous gate insulator layer 50 is removed from monocrystalline silicon layer 22 and a gate insulator layer 56 is formed at least at the surface of P-type regions 32 and N-type regions 34 and at planar upper surface 122. As described above, the gate insulator may be thermally grown silicon dioxide formed by heating the silicon substrate in an oxidizing ambient, or may be a deposited insulator such as a silicon oxide, silicon nitride, a high dielectric constant insulator such as HfSiO, or the like. Gate insulator 56 is here illustrated as a thermally grown silicon dioxide layer that grows only on the exposed silicon surfaces. The gate insulator thus grows at the surface of P-type regions 32, N-type regions 34 and at the planarized surface 122 of polycrystalline material 52. The gate insulator material is typically 1-10 nm in thickness. In accordance with one embodiment of the invention a layer of gate electrode forming material (not illustrated), preferably polycrystalline silicon, is deposited onto the layer of gate insulator. The gate electrode forming material will hereinafter be referred to for convenience but without limitation as polycrystalline silicon although those of skill in the art will recognize that other materials such as metals and metal silicides can also be employed. If the gate electrode material is polycrystalline silicon, that material is typically deposited to a thickness of about 50-200 nm and preferably to a thickness of about 100 nm by LPCVD by the hydrogen reduction of silane. The layer of polycrystalline silicon is preferably deposited as undoped polycrystalline silicon and is subsequently impurity doped by ion implantation. The polycrystalline silicon is patterned and etched using conventional processing to form gate electrodes 58 and 60. Gate electrode 58 will be the gate electrode of an NMOS transistor 62 and gate electrode 60 will be the gate of a PMOS transistor 64.

The method in accordance with this embodiment of the invention continues as illustrated in FIG. 12 by patterning and etching the planarized polycrystalline silicon layer 52 to form a gate electrode 154 of silicon carrier substrate MOS transistor 188. Gate electrode 154 overlies a portion of gate insulator 50 and serves to define a channel 190 of MOS transistor 188. Gate electrode 154 can also be used as an etch mask to remove exposed portions of gate insulator 50. In accordance with this embodiment of the invention gate electrode 154 does not overlie STI dielectric isolation region 30. The edge of gate electrode 154 is intended to align with the edge of N-type drift region 40, but because of possible misalignment during photolithographic processing may overlap a portion of the drift region. Side wall spacers 66 are formed on the side walls of gate electrodes 58 and 60 as well as on the side wall of gate electrode 154 and the side walls of openings 42 and 44 through STI 30 and insulating layer 26. The side wall spacers can be formed in conventional manner as described above.

Figure 13:
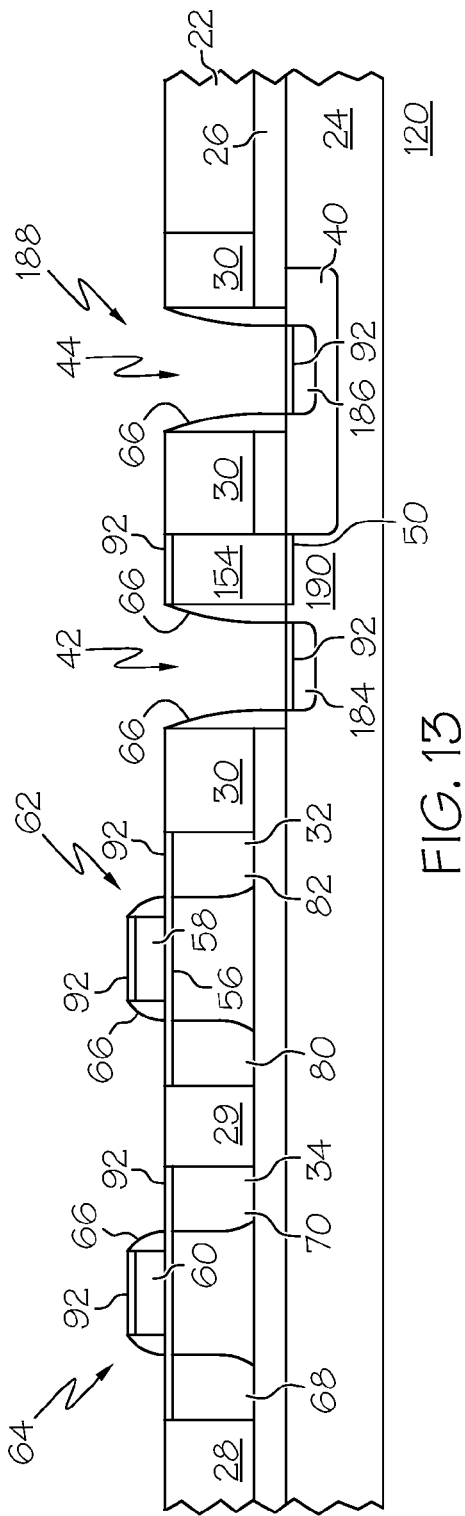

The method in accordance with this embodiment of the invention continues in the same manner as above described and illustrated in FIGS. 7 and 8 except for the configuration of gate electrode 154 in contrast to the configuration of gate electrode 54. P-type ions are implanted into monocrystalline silicon layer 22 in alignment with gate electrode 60 to form the source 68 and drain 70 regions of PMOS transistor 64 and N-type ions are implanted into the monocrystalline silicon layer in alignment with gate electrode 58 to form source 80 and drain 82 regions of NMOS transistor 62. While forming the source and drain regions of NMOS transistor 62, N-type ions are also implanted into monocrystalline silicon carrier substrate 24 in alignment with gate electrode 154 to form a source region 184 of substrate MOS transistor 188 and into N-type drift region 40 to form a drain region 186 of the substrate transistor as illustrated in FIG. 13. The source and drain regions of substrate transistor 188 are separated by channel region 190 and a portion of N-type drift region 40. The polycrystalline silicon gate electrodes can be ion implanted at the same time as the associated source and drain regions. Metal silicide contacts 92 are formed on the ion implanted regions in the manner described above.

Figure 14:
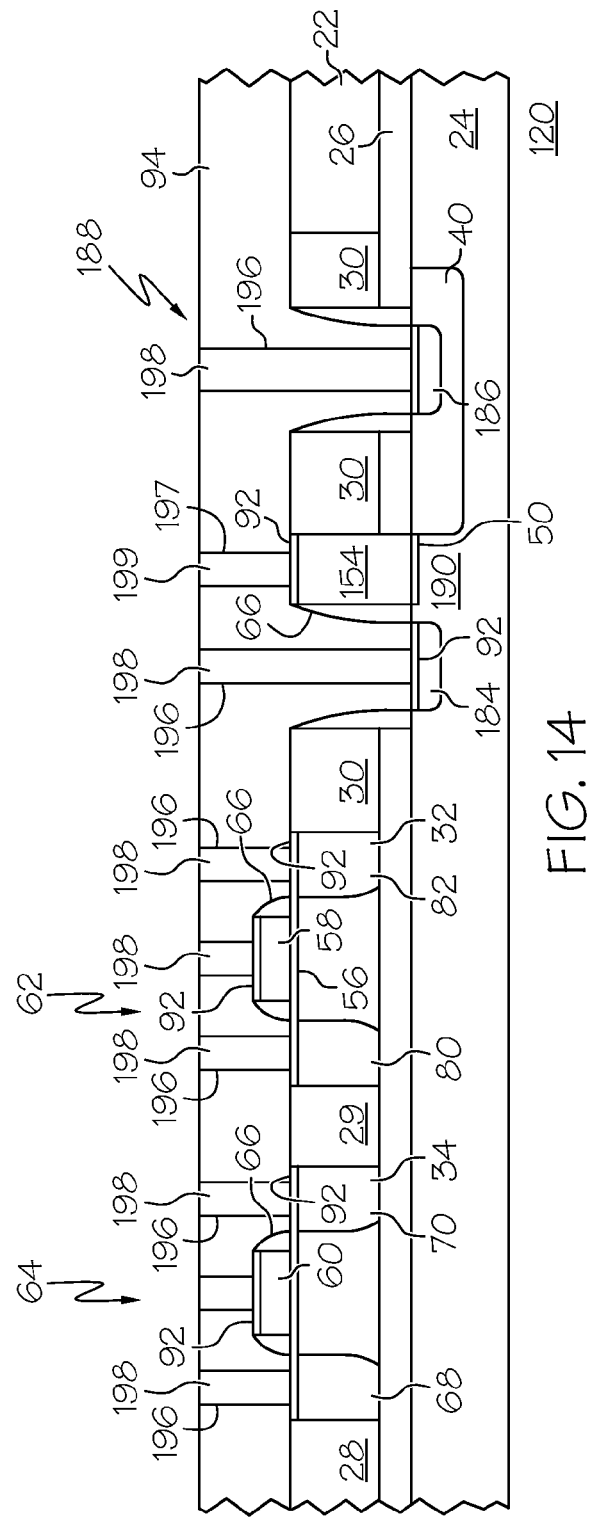

CMOS IC component structure 120 can be completed, in accordance with an embodiment of the invention as illustrate in FIG. 14 by depositing an ILD layer 94, etching contact vias 196 and 197 through ILD layer 94 and filling the contact vias with conductive plugs 198 and 199. The contact plugs make electrical contact to the silicided source and drain regions and to at least some of the gate electrodes. Contact via 197 can be patterned and etched to contact gate electrode 154 and may also overlie a portion of the portion of STI region 30 that overlies the edge of N-type drift region 40. Contact plug 199, formed in contact via 197, contacts gate electrode 154 and, although not so illustrated, may also overlie a portion of STI region 30. Those of skill in the art of semiconductor device manufacture will appreciate that other processing steps (not illustrated) may be practiced such as forming patterned interconnect metal lines, depositing and patterning additional ILD layers and additional metal interconnects, and the like to complete CMOS IC 120.

Yet another embodiment of the invention for the fabrication of a CMOS IC component 220 is illustrated in FIGS. 15-18 taken together with FIGS. 1-4 and 10. The method in accordance with this embodiment of the invention begins in the same manner as described and illustrated above in FIGS. 1-4 and 10. After polycrystalline silicon layer 52 is planarized, NMOS transistors 62 and PMOS transistors 64 can easily be fabricated in conventional manner in P-type well regions 32 and N-type well regions 34, in part because of the surface of the structure is planarized which facilitates photolithographic processing steps. As illustrated in FIG. 15, a gate insulator 56 is formed at the surface of the P-type well and the N-type well and a layer of gate electrode forming material such as polycrystalline silicon is deposited and patterned to form gate electrode 58 of NMOS transistor 62 and gate electrode 60 of PMOS transistor 64.

As illustrated in FIG. 16, a layer of masking material (not illustrated) such as a layer of photoresist is applied and patterned to protect NMOS transistor 62 and PMOS transistor 64 while planarized polycrystalline silicon layer 52 is removed. Gate insulator layer 50 is patterned and etched leaving a portion 250 of the insulator layer overlying a channel region 290.

The method in accordance with this embodiment of the invention continues by forming side wall spacers 266 as illustrated in FIG. 17. The side wall spacers can be formed in the same manner as described above by the deposition and subsequent anisotropic etching of a layer of side wall spacer forming material such as silicon nitride or the like. A layer of photoresist (not illustrated) or other masking material is applied and patterned. The patterned photoresist is used, together with side wall spacers 266, as an ion implantation mask and P-type conductivity determining ions are implanted into N-well regions 34 to form the source 68 and drain 70 regions of PMOS transistor 64. The layer of patterned photoresist is removed and another layer of masking material 272 is applied and patterned. Patterned photoresist layer 272, together with gate electrode 58 and side wall spacers 266 is used as an ion implantation mask and N-type conductivity determining ions such as arsenic ions are implanted into P-type well regions 32 to form source 80 and drain 82 regions of NMOS transistor 62 and source 284 and drain 286 regions of substrate transistor 288. Source region 284 is spaced apart from drain region 286 by a portion of n-type drift region 40 and channel region 290.

The exposed portions of gate insulator layer 56 are removed, patterned masking layer 272 is removed, and metal silicide contacts 92 are formed to the exposed portions of silicon, namely the exposed source and drain regions of each of the transistors and the top surfaces of the polycrystalline silicon gate electrodes. A layer of dielectric material 294 is deposited overlying NMOS transistor 62, PMOS transistor 64 and substrate transistor 288 as illustrate in FIG. 18. The upper surface of dielectric material 294 can be planarized, for example by CMP. Contact vias 295, 296, and 297 are etched through the dielectric material to form openings extending through the dielectric layer to the metal silicide contacts to source region 284, drain region 286, and to gate insulator 50, respectively. Opening 297 exposes gate insulator 50 and may also expose a portion of STI 30 overlying N-type drift region 40. Additional contact vias 96 also form openings extending through the dielectric layer the source, drain, and some of the gate electrodes of the NMOS and PMOS transistors formed in monocrystalline silicon layer 22. A conductive material such as a metallized plug 298, 299 is formed in each of the via openings. The conductive plugs can be formed in conventional manner, for example by forming sequential layers of a contacting metal, a blocking layer, and a plug material. For example, a contacting metal such as titanium can be deposited, a layer of titanium nitride can be formed either by deposition of titanium nitride or by the nitridation of a portion of the previously deposited titanium layer, and the remainder of the via can be filled with a CVD layer of tungsten. Alternatively a contacting and blocking layer of a material such as tantalum can be deposited followed by the electroless or electrolytic deposition of a material such as copper. Those of skill in the art will understand that a variety of process techniques are available for the filling of the vias with conductive materials. Conductive plug 299 fills via 297 and overlies gate insulator 50 and possibly a portion of STI region 30 and forms the gate electrode of substrate transistor 288. Preferably the conductive material used for the gate electrode is a material that has a near silicon band edge work function, especially a material such as titanium or tungsten. As explained above, additional conventional processing steps can be carried out to form patterned interconnect metal lines, deposit and pattern additional ILD layers and additional metal interconnects, and the like to complete CMOS IC 220.

The method for fabricating a CMOS IC component 320 in accordance with a further embodiment of the invention is illustrated in FIGS. 19-24 taken together with FIG. 1. The method begins by providing an SOI substrate 21 as illustrated in FIG. 1 and as described above. Having provided an SOI substrate 21, the method in accordance with this embodiment of the invention continues as illustrated in FIG. 19 by the formation of dielectric isolation regions 28, 29, 330, and 331 extending through monocrystalline silicon layer 22 to dielectric layer 26. The dielectric isolation regions are preferably formed by the well known shallow trench isolation (STI) technique as described above. STI regions 28 and 29 provide electrical isolation, as needed, between various devices of the CMOS circuit that are to be formed in monocrystalline silicon layer 22. STI regions 330 and 331, separated by a remaining portion 333 of monocrystalline silicon layer 22, will aid in electrically isolating the device to be formed in carrier substrate 24 from the devices to be formed in monocrystalline silicon layer 22 and will be used in forming the substrate devices. Either before or after the formation of dielectric isolation regions 28, 29, 330, and 331, portions of monocrystalline silicon layer 22 can be doped, for example by ion implantation, to form P-type well regions 32 and N-type well regions 34.

As also illustrated in FIG. 19, a layer of masking material 336 such as a layer of photoresist is applied overlying the surface of silicon layer 22 and is patterned to form a mask opening 337 overlying STI region 331 and thin silicon region 333. N-type conductivity determining ions are implanted, as indicated by arrows 338, through the mask opening, STI region 331, thin silicon region 333, and BOX layer 26 and into supporting substrate 24 to form an N-type drift region 40. The implanted ions can be, for example, phosphorous ions implanted at an energy of about 200-250 KeV and a dose of about $2 \times 10^{13}$ $cm^{-2}$. The ion implantation and subsequent thermal cycling to which the implanted ions are subjected forms a drift region having a junction depth of about 0.5 microns (μ).

Masking material 336 is removed and another masking layer (not illustrated) is applied and patterned. The patterned masking layer is used together with silicon region 333 as an etch mask and openings 42 and 44 are etched through STI regions 330 and 331 and through underlying dielectric layer 26 to expose portion 46 of the surface of supporting semiconductor substrate 24 and portion 48 of the surface of drift region 40 as illustrated in FIG. 20. A gate insulator 50 is formed on exposed portion 46 and exposed portion 48. Preferably the gate insulator is thermally grown silicon dioxide having a thickness of about 5-10 nm and formed in conventional manner by subjecting the exposed surfaces to an oxidizing ambient at an elevated temperature.

Figure 21:
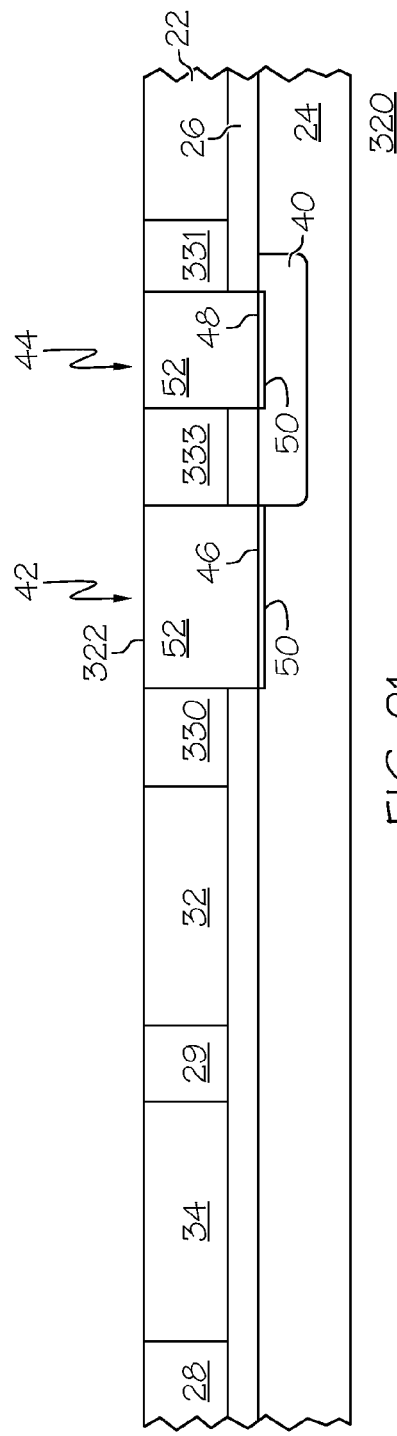

A layer of polycrystalline silicon 52 or other gate electrode forming material (not illustrated) is blanket deposited to fill openings 42 and 44. The gate electrode forming material will hereinafter be referred to for convenience, but without limitation, as polycrystalline silicon. The polycrystalline silicon can be deposited to a thickness of about 150-250 nm by chemical vapor deposition (CVD), low pressure chemical vapor deposition (LPCVD), or plasma enhanced chemical vapor deposition (PECVD) by the reduction of silane ($SiH_4$) or other silicon bearing reactant. Preferably the polycrystalline silicon is in situ doped by including dopant impurities such as arsenic or phosphorous in the reactant gases. As illustrated in FIG. 21, the polycrystalline silicon layer is planarized, for example by CMP, so as to form a planar upper surface 322. The STI dielectric isolation regions can be used as a polish stop during the CMP operation. Planarizing the polycrystalline silicon layer removes the polycrystalline silicon from the surface of the STI and from monocrystalline silicon layer 22 including portion 333 of silicon layer 22 and the planarized surface makes subsequent photolithography steps easier than would be the case with a non-planarized surface.

Figure 22:
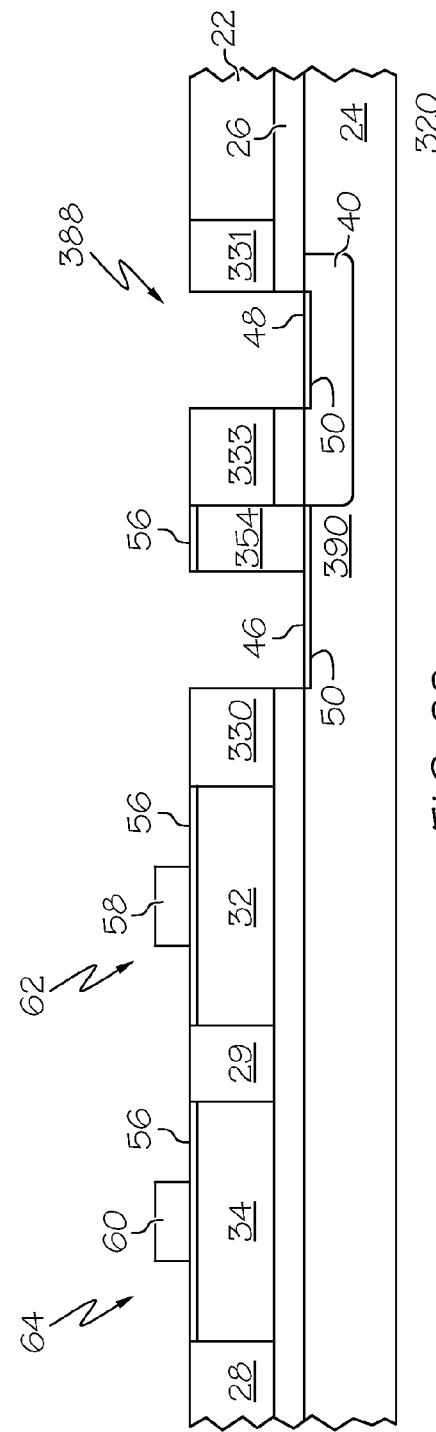

As illustrated in FIG. 22, a gate insulator layer 56 is formed at least at the surface of P-type regions 32 and N-type regions 34 and at planar upper surface 322 of polycrystalline silicon layer 52. As described above, the gate insulator may be thermally grown silicon dioxide or may be a deposited insulator such as a silicon oxide, silicon nitride, a high dielectric constant insulator such as HfSiO, or the like. Gate insulator 56 is here illustrated as a thermally grown silicon dioxide layer that grows only on the exposed silicon surfaces. The gate insulator thus grows at the surface of P-type regions 32, N-type regions 34 and at the planarized surface 322 of polycrystalline material 52. The gate insulator material is typically 1-10 nm in thickness. In accordance with one embodiment of the invention a layer of gate electrode forming material (not illustrated), preferably polycrystalline silicon, is deposited onto the layer of gate insulator. The gate electrode forming material will hereinafter be referred to for convenience but without limitation as polycrystalline silicon although those of skill in the art will recognize that other materials such as metals and metal silicides can also be employed. If the gate electrode material is polycrystalline silicon, that material is typically deposited to a thickness of about 50-200 nm and preferably to a thickness of about 100 nm by LPCVD by the hydrogen reduction of silane. The layer of polycrystalline silicon is preferably deposited as undoped polycrystalline silicon and is subsequently impurity doped by ion implantation. The polycrystalline silicon is patterned and etched using conventional processing to form gate electrodes 58 and 60. Gate electrode 58 will be the gate electrode of an NMOS transistor 62 and gate electrode 60 will be the gate of a PMOS transistor 64. Either in the same steps used to pattern and etch gate electrodes 58 and 60 or in subsequent photolithography and etch steps planarized polycrystalline silicon layer 52 is also patterned to form a gate electrode 354 of silicon carrier substrate transistor 388. Gate electrode 354 overlies a channel region 390 of transistor 388.

Figure 23:
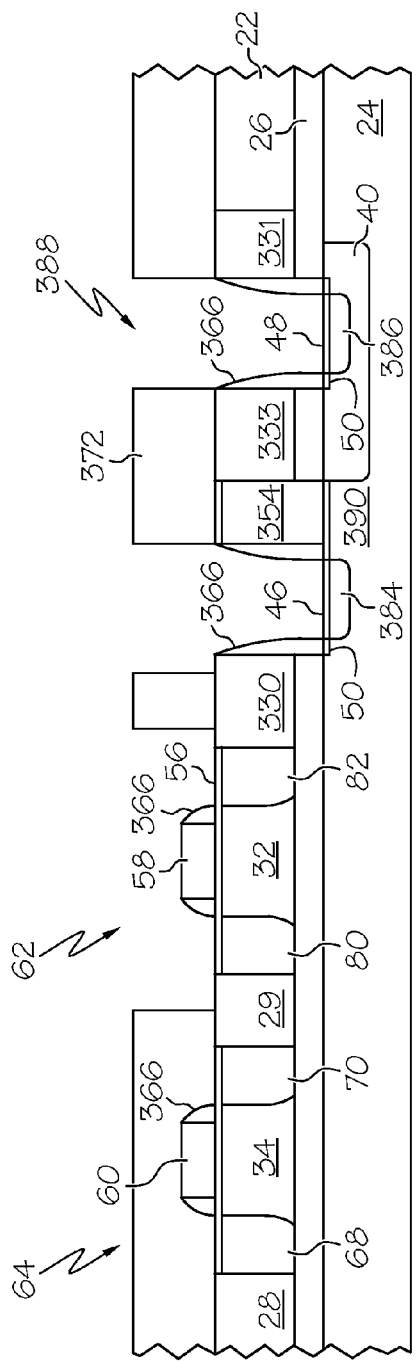
Figure 24:
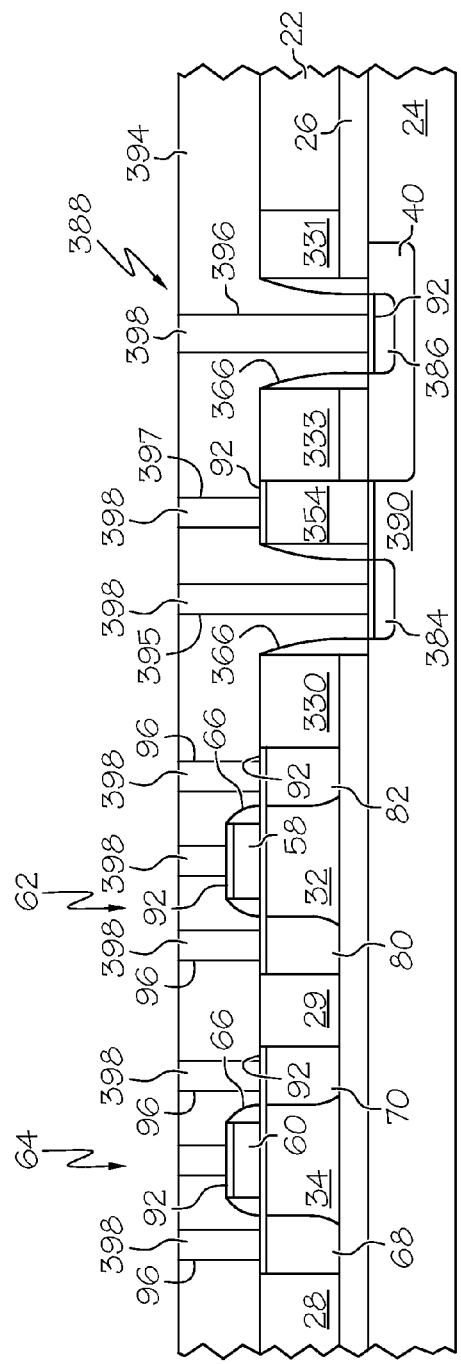

The method in accordance with this embodiment of the invention continues by forming side wall spacers 366 as illustrated in FIG. 23. The side wall spacers can be formed in the same manner as described above by the deposition and subsequent anisotropic etching of a layer of side wall spacer forming material such as silicon nitride or the like. A layer of photoresist (not illustrated) or other masking material is applied and patterned. The patterned photoresist is used, together with side wall spacers 366, as an ion implantation mask and P-type conductivity determining ions are implanted into N-well regions 34 to form the source 68 and drain 70 regions of PMOS transistor 64. The layer of patterned photoresist is removed and another layer of masking material 372 is applied and patterned. Patterned photoresist layer 372, together with gate electrodes 58 and 354 and side wall spacers 366 is used as an ion implantation mask and N-type conductivity determining ions such as arsenic ions are implanted into P-type well regions 32 to form source 80 and drain 82 regions of NMOS transistor 62 and also source 384 and drain 386 regions of substrate transistor 388. Source region 384 is spaced apart from drain region 386 by a portion of n-type drift region 40 and channel region 390.

The exposed portions of gate insulators 50 and 56 are removed, patterned masking layer 372 is removed, and metal silicide contacts 92 are formed to the exposed portions of silicon, namely the exposed source and drain regions of each of the transistors and the top surfaces of the polycrystalline silicon gate electrodes. A layer of dielectric material 394 is deposited overlying NMOS transistor 62, PMOS transistor 64 and substrate transistor 388 as illustrate in FIG. 24. The upper surface of dielectric material 394 can be planarized, for example by CMP. Contact vias 395, 396, and 397 are etched through the dielectric material to form openings extending through the dielectric layer to expose the metal silicide contacts to source region 384, drain region 386, and to gate electrode 354, respectively. Additional contact vias 96 also form openings extending through the dielectric layer the source, drain, and some of the gate electrodes of the NMOS and PMOS transistors formed in monocrystalline silicon layer 22. A conductive material such as a metallized plug 398 is formed in each of the via openings to provide electrical contact to the various device regions. The conductive plugs can be formed in conventional manner, for example by forming sequential layers of a contacting metal, a blocking layer, and a plug material. For example, a contacting metal such as titanium can be deposited, a layer of titanium nitride can be formed either by deposition of titanium nitride or by the nitridation of a portion of the previously deposited titanium layer, and the remainder of the via can be filled with a CVD layer of tungsten. Alternatively a contacting and blocking layer of a material such as tantalum can be deposited followed by the electroless or electrolytic deposition of a material such as copper. Those of skill in the art will understand that a variety of process techniques are available for the filling of the vias with conductive materials. As explained above, additional conventional processing steps can be carried out to form patterned interconnect metal lines, deposit and pattern additional ILD layers and additional metal interconnects, and the like to complete CMOS IC 320.

The voltage handling characteristics of the MOS transistor formed in the silicon carrier substrate, in accordance with each of the above described embodiments, is enhanced by the presence of N-type drift region 40 in series between the channel region and the drain region of the transistor. The drift region, for example, helps to spread the depletion region of a reverse biased drain to substrate junction.

While a limited number of exemplary embodiments have been presented in the foregoing detailed description, it should be appreciated that a vast number of variations exist. It should also be appreciated that the exemplary embodiments are only examples, and are not intended to limit the scope, applicability, or configuration of the invention in any way. Rather, the foregoing detailed description will provide those skilled in the art with a convenient road map for implementing the exemplary embodiments. It should be understood that various changes can be made in the function and arrangement of elements without departing from the scope of the invention as set forth in the appended claims and the legal equivalents thereof.

What is claimed is:

1. A semiconductor component including a semiconductor on insulator (SOI) substrate having a first semiconductor layer, a layer of insulator on the first semiconductor layer, and a second semiconductor layer overlying the layer of insulator, the semiconductor component comprising:
   a source region and a drain region of a first conductivity type spaced apart in the first semiconductor layer of a second conductivity type, the drain region having a first doping concentration of the first conductivity determining dopant;
   a channel region of the second conductivity type located between the source region and the drain region;
   a gate electrode overlying the channel region; and
   a drift region of the first conductivity type located between the channel region and the drain region, the drift region having a second doping concentration less than the first doping concentration of the first conductivity determining dopant.

2. The semiconductor component of claim 1, wherein the gate electrode overlies a portion of the drift region but not the entirety of the drift region.

3. The semiconductor component of claim 1, further comprising:
   a first N-channel MOS transistor formed in and overlying the second semiconductor layer; and
   a second P-channel MOS transistor formed in and overlying the second semiconductor layer.

4. The semiconductor component of claim 3, further comprising:
   a MOS transistor formed in and on the first semiconductor layer, the MOS transistor comprising the source region, the drain region and the gate electrode.

5. The semiconductor component of claim 1, wherein the drift region is positioned in series between the channel region and the drain region.

6. The semiconductor component of claim 1, further comprising:
   a gate insulating layer underlying the gate electrode and the second semiconductor layer, and wherein a portion of the gate electrode underlies the second semiconductor layer.

7. A semiconductor component, comprising:
   a semiconductor on insulator (SOI) substrate comprising a first semiconductor layer of first conductivity type, a layer of insulator on the first semiconductor layer, and a second semiconductor layer overlying the layer of insulator; and a MOS transistor formed in and on the first semiconductor layer, the MOS transistor comprising:
  a drift region of a second conductivity type formed in the first semiconductor layer;
  a drain region formed in a portion of the drift region, and a source region formed in a portion of the first semiconductor layer adjacent the drift region, wherein the drain region and the source region are of the second conductivity type and are spaced apart in the first semiconductor layer; and
  a gate electrode overlying the first semiconductor layer adjacent the drift region, the gate electrode overlying a channel region in the first semiconductor layer between the source region and the drain region.

8. The semiconductor component of claim 7, wherein a portion of the gate electrode underlies the second semiconductor layer, and further comprising:
  a gate insulating layer underlying the gate electrode and the second semiconductor layer and overlying the portion of the first semiconductor layer adjacent the drift region.

9. The semiconductor component of claim 7, wherein the drift region is positioned in series between the channel region and the drain region.

10. The semiconductor component of claim 7, wherein the drain region has a first doping concentration of the second conductivity determining dopant, wherein the channel region is of the first conductivity type, and wherein the drift region has a second doping concentration less than the first doping concentration of the second conductivity determining dopant.

11. The semiconductor component of claim 7, further comprising:
  a P-channel MOS transistor formed in and overlying the second semiconductor layer;
  an N-channel MOS transistor formed in and overlying the second semiconductor layer;
  wherein the gate electrode of the MOS transistor is formed at least partly beneath the second semiconductor layer and adjacent the drift region.

12. The semiconductor component of claim 11, further comprising:
  an insulating region extending through the second semiconductor layer to the layer of insulator, the insulating region electrically isolating the MOS transistor formed in the first semiconductor layer from the first N-channel MOS transistor formed in the second semiconductor layer and from the second P-channel MOS transistor formed in the second semiconductor layer.

13. The semiconductor component of claim 12, wherein the gate electrode at least partially overlies the insulating region and is positioned overlying the drift region.

14. A semiconductor component, comprising:
  a semiconductor on insulator (SOI) substrate having a first semiconductor layer of a first conductivity type, a layer of insulator on the first semiconductor layer, and a second semiconductor layer overlying the layer of insulator;
  a MOS transistor formed in and on the first semiconductor layer, the MOS transistor comprising:
    a drift region having a second conductivity type and being formed in the first semiconductor layer;
    a drain region having the second conductivity type and being formed in a portion of the drift region;
    a source region having the second conductivity type and being formed in the first semiconductor layer; and
    a gate structure comprising: a gate insulating layer overlying the first semiconductor layer, and a gate electrode material overlying the gate insulating layer; and
    a channel region located in the first semiconductor layer between the drain region and the source region, the channel region being of the first conductivity type, wherein the drift region is positioned in series between the channel region and the drain region;
  a P-channel MOS transistor formed in and on the second semiconductor layer; and
  an N-channel MOS transistor formed in and on the second semiconductor layer.

15. The semiconductor component of claim 14, wherein the drift region is positioned underlying a portion of the second semiconductor layer.

16. The semiconductor component of claim 14, wherein the gate electrode overlies the second portion of the first semiconductor layer that is adjacent the drift region.

17. The semiconductor component of claim 14, wherein gate electrode extends through the second semiconductor layer and the layer of insulator to the gate insulating layer.

18. The semiconductor component of claim 14, further comprising:
  an insulating region that overlies a portion of the layer of insulator, wherein the gate electrode overlies the gate insulating layer and the portion of the insulating region.

19. The semiconductor component of claim 14, wherein the drain region has a first doping concentration of the second conductivity determining dopant, and the drift region has a second doping concentration less than the first doping concentration of the second conductivity determining dopant.

20. The semiconductor component of claim 14, wherein the gate insulating layer underlies the second semiconductor layer, and wherein a portion of the gate electrode underlies the second semiconductor layer.

* * * * *